United States Patent [19]

Foell et al.

[11] Patent Number: 5,209,833

[45] Date of Patent: *May 11, 1993

[54] METHOD AND APPARATUS FOR LARGE-AREA ELECTRICAL CONTACTING OF A SEMICONDUCTOR CRYSTAL BODY WITH THE ASSISTANCE OF ELECTROLYTES

[75] Inventors: Helmut Foell; Volker Lehmann, both of Munich, Fed. Rep. of Germany

[73] Assignee: Siemens Aktiengesellschaft, Munich, Fed. Rep. of Germany

[ * ] Notice: The portion of the term of this patent subsequent to Jun. 20, 2006 has been disclaimed.

[21] Appl. No.: 527,277

[22] Filed: May 22, 1990

[30] Foreign Application Priority Data

May 31, 1989 [DE] Fed. Rep. of Germany ....... 3917723

[51] Int. Cl.$^5$ ............................................. G01R 31/26
[52] U.S. Cl. ...................................... 205/91; 205/123; 204/130; 204/242; 204/252; 204/129.3; 437/19
[58] Field of Search ................. 204/130, 34.5, 242, 204/252, 129.3, 129.75; 437/19, 180, 228, 241; 205/91, 123

[56] References Cited

U.S. PATENT DOCUMENTS

| | | | |
|---|---|---|---|
| 3,010,885 | 11/1961 | Schink | 204/34.5 |
| 3,476,661 | 11/1969 | Jahn | 204/34.5 |
| 4,108,738 | 8/1978 | Yi Cho et al. | 204/34.5 |
| 4,166,918 | 9/1979 | Nostrand et al. | 136/89 R |
| 4,197,141 | 4/1980 | Bozler et al. | 136/89 TF |
| 4,385,971 | 5/1983 | Swartz | 204/129.1 |
| 4,427,513 | 1/1984 | Skotheim et al. | 204/300 EC |
| 4,601,960 | 7/1986 | Menezes et al. | 204/34.5 |
| 4,613,417 | 9/1986 | Laskowski et al. | 204/129.85 |
| 4,628,591 | 12/1986 | Zorinsky et al. | 29/576 W |
| 4,649,227 | 3/1987 | Tributsch et al. | 204/129.75 |
| 4,734,168 | 3/1988 | Bockris et al. | 204/34.5 |
| 4,786,391 | 11/1988 | Clemens | 204/247 |
| 4,841,239 | 6/1989 | Foell et al. | 324/158 R |

FOREIGN PATENT DOCUMENTS 0037876 10/1981 European Pat. Off. .
1514697 6/1978 United Kingdom .

OTHER PUBLICATIONS

Hoffman H. et al. "Photo-Enhanced Etching of n-Si", Appl. Phys., vol. 33, 1984, pp. 243-245.
Grivet F., et al, "Device for Detecting Defects in P. Silicon Substrate", IBM Technical Disclosure Bulletin, vol. 22, No. 4, Sep. 1979, p. 1499.
D2S, G., "Nondestructive Electrolytic Localization of Pipe Sites in Bipolar Transistors," IBM Technical Disclosure Bulletin, vol. 20, No. 2, (1977).

Primary Examiner—John Niebling
Assistant Examiner—Arun S. Phasge
Attorney, Agent, or Firm—Hill, Steadman & Simpson

[57] ABSTRACT

A semiconductor crystal wafer is fixed between two electrolyte-filled cells so that the front surface and rear surface thereof are respectively in contact with an electrolyte. A respective electrode is located in the electrolyte, a DC voltage being applied between these electrodes so that the semiconductor-to-electrolyte contact of the one cell is polarized in the conducting direction and the other is polarized in the non-conducting direction. A current flow through the semiconductor crystal body is enabled in that the inhibiting surface of the semiconductor crystal is illuminated and charge carriers are generated as a result thereof. On the basis of the selection of suitable electrolytes and the intensity of illumination, high current density is possible even given high-impedance semiconductor crystal wafers as well as semiconductor crystal bodies having doping steps or pn junctions. The method is particularly simple in many semiconductor processing and analyses methods.

10 Claims, 3 Drawing Sheets

1250........ 1350 uA

1590........ 1620 uA

METHOD AND APPARATUS FOR LARGE-AREA ELECTRICAL CONTACTING OF A SEMICONDUCTOR CRYSTAL BODY WITH THE ASSISTANCE OF ELECTROLYTES

CROSS-REFERENCE TO RELATED APPLICATIONS

This application is related to an application Ser. No. 522,115, filed May 11, 1990 now U.S. Pat. No. 5,010,294 and to an application Ser. No. 510,683 filed Apr. 18, 1990 now abandoned.

BACKGROUND OF THE INVENTION

1. Field of the Invention

The present invention relates to a method and apparatus for large-area electrical contacting of semiconductors, and more specifically to the contacting of the semiconductor crystal body with the assistance of electrolytes, whereby a first cell having a first electrode is applied to a front side of the semiconductor body, a second cell having a second electrode is applied to the rear side of the semiconductor body, at least the second cell is filled with an electrolyte that contacts the electrode with the rear side of a semiconductor crystal body, and a voltage is applied between the two electrodes, with which method and apparatus good electrical contacts with high-current loadability can be produced.

2. Description of the Prior Art

The production of such contacts to semiconductor surfaces is of technical interest for many reasons. One is, for example, for use in electro-chemical processes wherein portions of the surface of the semiconductor are exposed to an electrolyte. Some applications with reference to the example of silicon are: electro-polishing, hole etching, production of what are referred to as porous silicon layers, electrode deposition, and mensurational purposes.

In the aforementioned processes, the rear side or, more generally, portions of the surface not exposed to the electrolyte were previously provided with an ohmic contact for supplying the required current. Producing good electrical contacts on semiconductors, however, is generally a difficult and non-destruction-free process that usually requires a pre-treatment of the semiconductor and the application of one or more metal layers. Relatively good contacts can also be produced by rubbing indium-gallium eutectic into the rear side to be contacted, as described in the article by Lehmann et al in the *JPL Publication,* Vol. 84, No. 23, 1983, pp. 527 et seq., The method, however, is not suitable for large-area contacts and for industrial-scale applications.

The manufacture of less good (non-ohmic) contacts by pressing metal plates or tips on is, in fact, more simple, but often does not satisfy the requirements that are made of the contact resistance and the uniformity of the current flow through the wafer.

U.S. Pat. No. 4,628,591, Zorinsky et al, discloses a power supply via an electrolyte contact. The rear surface is thereby, likewise, brought into contact with an electrolyte. An electrolyte is located therein that is connected via a DC voltage source to the electrode in the electrolyte at the front surface of the semiconductor wafer (working side). The required current flow through the electrolyte at the front side causes a polarization of the DC source such that a current can flow through the electrolyte at the rear side, only given extremely high voltages, since the electrolyte cell, at the rear side, represents a diode polarized in the non-conducting direction. The magnitude of the required voltage is dependent on the specific resistance $\rho$ of the semiconductor crystal, so that the method can only be utilized for semiconductors having a specific resistance $\rho$ approximately equal to or less than 0.1 ohm cm.

SUMMARY OF THE INVENTION

It is, therefore, an object of the present invention to provide a simple, non-destructive, electrical contacting of semiconductor crystal bodies that does justice to the stated contact requirements, particularly compatibility of high-current densities and no limitation to semiconductors having low specific resistance.

In a method of the type generally set forth above, the above object is achieved, according to the present invention, in that a current flow from the first electrode through the semiconductor crystal body to the second electrode is established with the assistance of at least one of the parameters: voltage, type of electrolyte, electrolyte concentration, intensity of illumination of the front side or of the rear side of the semiconductor crystal body.

According to a feature thereof, the present invention is particularly characterized in that the first cell is polarized in the conducting direction and the second cell is polarized in the non-conducting direction, due to the applied voltage, and in that the parameter is the intensity of illumination of the rear side of the semiconductor crystal body.

According to another feature, the invention is particularly characterized in that the second cell is polarized in the conducting direction, due to the applied voltage, the first cell is filled with a gas or with a gas mixture or with an electrolyte or direct contact between the front surface of the semiconductor crystal body and the first electrode is provided, and the parameter is at least one of the group: voltage, type of electrolyte, electrolyte concentration.

According to another feature of the invention, the invention is particularly characterized in that the second cell is polarized in the conducting direction and the first cell is polarized in the non-conducting direction, due to the applied voltage, the first cell is filled with an electrolyte, and the parameter is the intensity of illumination at the front side of the semiconductor crystal body.

According to another feature of the invention, the invention is particularly characterized in that an electrical control circuit is provided for maintaining an optimum operating point.

According to another feature of the invention, the invention is particularly characterized in that the illumination of the front or rear surface of the semiconductor body occurs over the entire surface.

According to another feature of the invention, the invention is particularly characterized in that the semiconductor crystal body is scanned with a punctiform light spot.

According to another feature of the invention, the invention is particularly characterized in that a DC voltage source is employed whose poles are each respectively connected to an electrode.

According to another feature of the invention, the invention is particularly characterized in that two series-connected DC voltage sources are employed that are each respectively connected to an electrode and are connected in common to the semiconductor crystal body via an ohmic contact, whereby opposite poles of the voltage sources are applied to the common pole and the common pole is applied to a defined potential.

According to another feature of the invention, the invention is particularly characterized in that the invention is used with respect to semiconductor crystal bodies having doping steps or pn junctions therein.

BRIEF DESCRIPTION OF THE DRAWINGS

Other objects, features and advantages of the invention, its organization, construction and operation will be best understood from the following detailed description, taken in conjunction with the accompanying drawings, on which:

FIGS. 4 and 5 are representations of topically-resolved measurements of the photocurrent of a p silicon wafer, wherein FIG. 4 illustrates the utilization of a traditional power supply and FIG. 5 illustrates the utilization of the power supply of the present invention.

DESCRIPTION OF THE PREFERRED EMBODIMENTS

Figure 1:
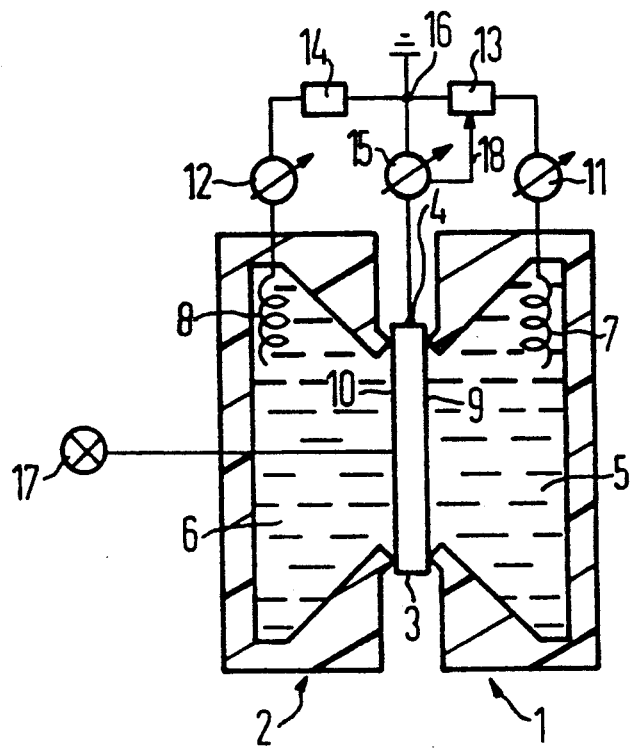
FIG. 1 is a schematic representation of a greatly-simplified cross-sectional view through an electrolyte double cell.

In one embodiment of the invention, a semiconductor crystal body 3 (hereinafter referred to as a "wafer") in FIG. 1 is situated between two half-cells 1, 2 (hereinafter referred to simply as "cells") filled with electrolyte 5, 6; such a structure is disclosed in the European Application 0 295 440. For example, 2% hydrofluoric acid with the addition of a wetting agent can be employed as the electrolyte. The electrolyte 5 in the first cell 1 is in contact with an electrode 7 and with the front surface 9 of the wafer 3 that always represents the working side in the following description. The wafer 3 is connected to a DC voltage source 13 via an ohmic contact 4 and via an ammeter 15, the other pole of the DC voltage source 13 is connected to the electrode 7 via an ammeter 11.

The second cell 2 at the rear side 10 of the wafer is analogously constructed: a second electrode 8 in the electrolyte 6 is connected to a DC voltage source 14 via an ammeter 12, the other pole of the DC voltage source 14 being likewise connected to the wafer 3 via an ammeter 15 and the ohmic contact 4. The common pole 16 can be connected to a defined potential, for example, to ground. The electrolyte can be circulated and aerated (not shown) in each cell. The working or measuring step to be carried out at the front surface 9 always requires a current flow from the semiconductor wafer 3 through the electrolyte 5 in the first cell 1 to the first electrode 7.

In accordance with the present invention, the current supply occurs via the semiconductor-to-electrode contact at the rear surface 10 of the wafer. The two cells 1, 2 can be viewed as being independent from one another; their current-voltage characteristics are established only by the chemical reactions at the respective boundary surfaces of electrolyte-to-semiconductor and electrolyte-to-electrode. For freely-selected voltages $U_1$ at the voltage source 13 and $U_2$ at the voltage source 14, the current $I_1$ and $I_2$ flow in the two cells 1, 2 corresponding to the respective characteristic. According to Kirchhoff's laws, the differential current $I_3 = I_1 - I_2$ flows through the ammeter 15. For practical applications, $I_3 = 0$ should usually apply.

This requires a series connection of the voltage sources 13 and 14, such that opposite poles are applied to the common pole 16. The two voltages must be selected such that $I_1 \approx -I_2$ applies. Since one of the two cells 1, 2 is always polarized as a result thereof, such that the semiconductor-to-electrolyte contact inhibits, this condition can be satisfied in practice only when the inhibiting semiconductor surface is illuminated so that a photocurrent flows due to the production of minority carriers.

Figure 2:
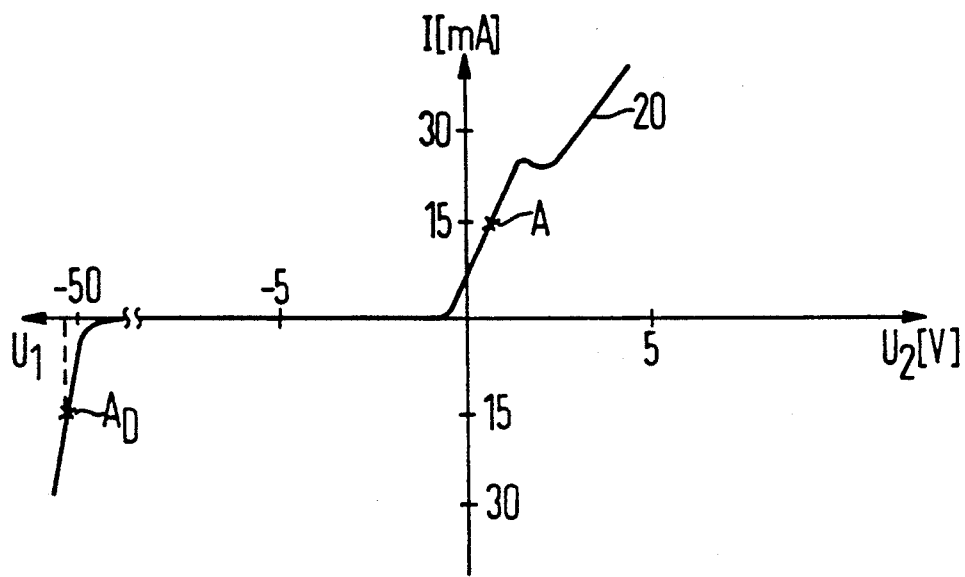
FIGS. 2 and 3 are graphic representations of the characteristics of the systems with reference to the example of p silicon, with FIG. 2 illustrating the characteristics without illumination and FIG. 3 illustrating the characteristics with illumination.
Figure 3:
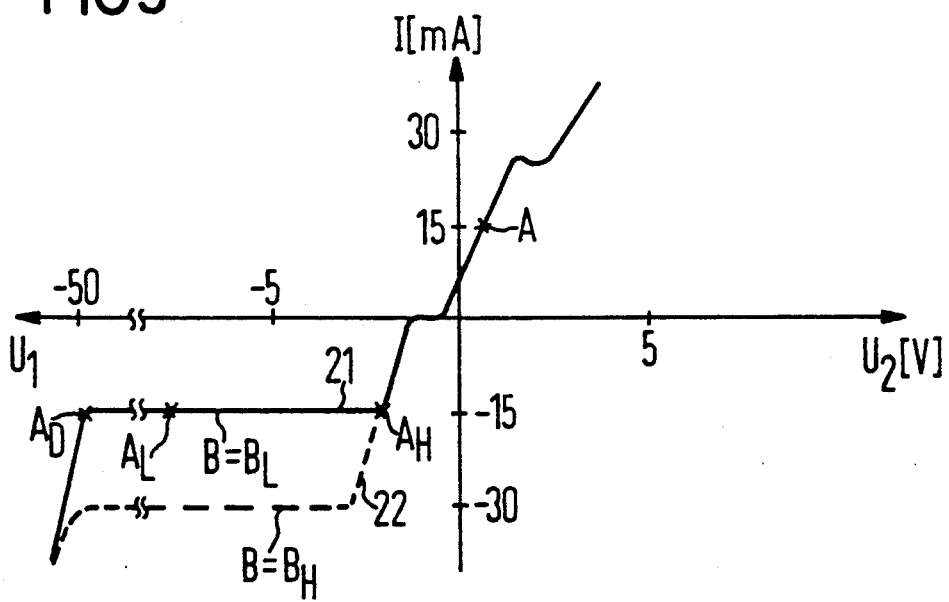

FIGS. 2 and 3 illustrate the characteristics 20, 21, 22 without and with illumination with reference to the example of p-silicon as the semiconductor having a specific resistance $\rho$ of approximately 1 ohm cm in an approximately 2.5% HF electrolyte (See V. Lehmann et al in "Proceedings of the Flat-Plate Solar Array Project Research Forum on the High Speed Growth And Characterization of Crystals for Solar Cells", *JPL-Publication*, Vol. 84, No. 23, 1983, pp. 527 et seq.).

The intensity of current (i.e. the operating point) required dependent on application can be set with the assistance of the parameters of the systems, such as voltage, type of electrolyte, concentration of electrolyte, and intensity of illumination, and can be readjusted with the assistance of a control loop 18 in what are electro-chemical processes that are generally not constant over time.

With reference to the example p silicon as the semiconductor material, the invention shall be set forth in greater detail with reference to the characteristics 20, 21, 22 in FIGS. 2 and 3.

Assume that the front surface 9 of the wafer 3 that is to be processed is anodically connected (i.e., positive pole of DC voltage source 13 at the semiconductor wafer 3). Assume the desired current $I_1$ in the cell 1 to be 15 mA (operating point A). The required voltage $U_1$ derives from the right-hand part of the characteristic 20 in FIG. 2, deriving at $U_1$ of approximately 0.8 volts. The supply of the required 15 mA through the electrolyte 6 in the second cell 2 occurs as a result of the photocurrent that is generated by the illumination of the rear surface 10 of the wafer with the light source 17.

It may be seen with reference to FIG. 3 that the illumination of the rear surface 10 of the wafer offers two possibilities for selecting the operating point in the second cell 2:

a) the intensity B of the illumination is selected such that the desired current just flows ($B = B_L$, operating point $A_L$ on the characteristic 21 in FIG. 3). For 15 mA, the intensity of illumination must amount to approximately 460W/cm$^2$, given a spectral distribution corresponding to sunlight;

b) the intensity of illumination is selected such that the photocurrent somewhat greater than the desired current ($B = B_H$, characteristic 22). The operating point $A_H$ is placed into the ascending branch of the characteristic given low voltages.

Dependent on the application, the wafer can be illuminated on a surface-wide basis or can be scanned with a punctiform light spot (by focusing the light beam and/or by employing a laser). Given a current that is not chronologically constant, a control 18 is achieved with, for example, the assistance of the condition $I_3=0$ in that the voltage $U_2$ is modified such that the current $I_3$ disappears.

FURTHER EMBODIMENTS AND APPLICATIONS

1) p-doped silicon

Conversely, the rear surface 10 can be anodically connected and the front surface 9 can be cathodically connected. In this case, the front surface 9 is generally illuminated with a light source (not shown) since the first cell 1 inhibits given darkness. The possibility of punctiform illumination is particularly utilized given this type of connection in order to be able to work with topical resolution.

Figure 4:
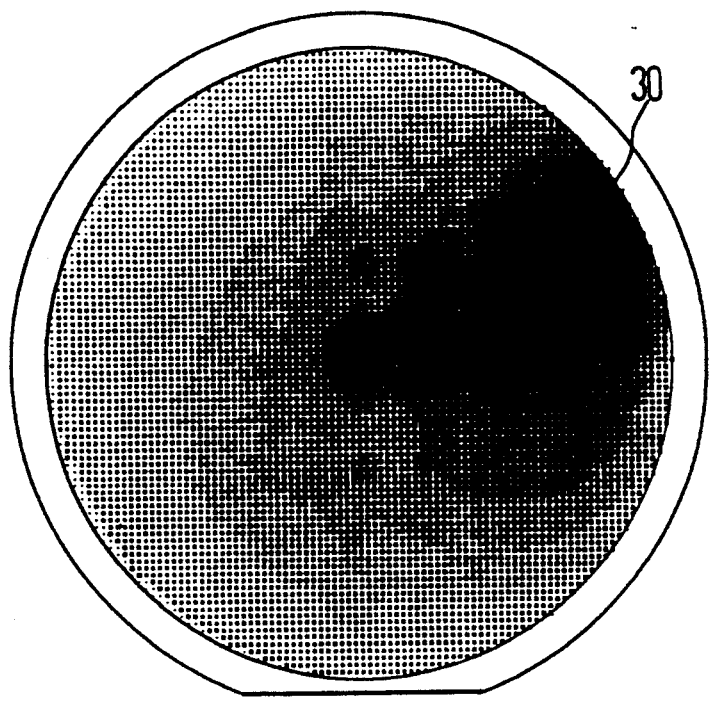
Figure 5:
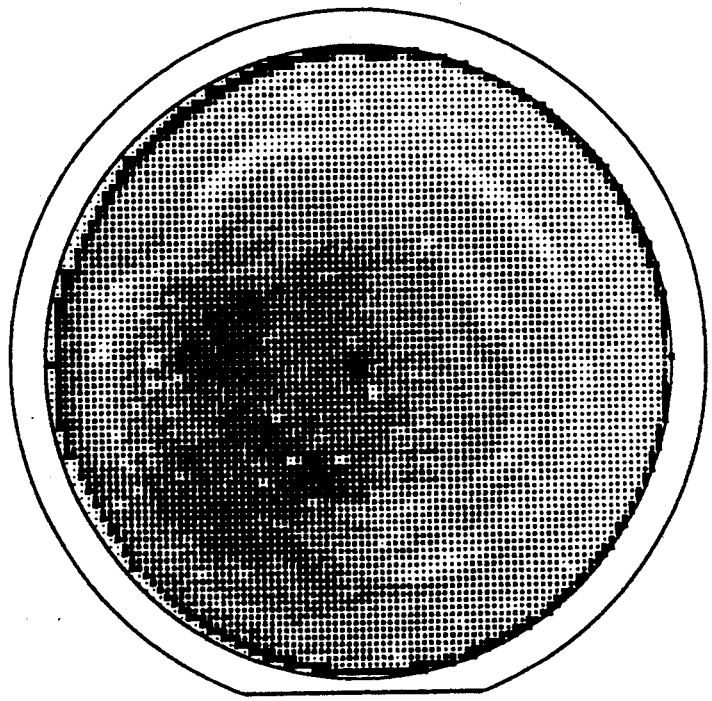

An applied example of this embodiment is the topically-resolved measurement of photocurrents for determining the diffusion length of the minority carriers in the semiconductor material. A comparison of the method of the present invention with a traditional method is shown in FIGS. 4 and 5, with reference to such a measurement. The front surface 9 of the p-silicon wafer 3 polarized in the non-conducting direction was exposed to a 1% hydrofluoric acid electrolyte 5 and was scanned with a helium-neon laser beam. The photocurrent thereby flowing was measured and graphically portrayed in a gray value scale.

For the measurement on which FIG. 4 is based, the traditional method was employed with a current supply via a contact needle at the edge of the wafer. For the measurement on which FIG. 5 is based, the current supply via an electrolyte contact at the rear surface 10 of the wafer was employed. Whereas, the influence of the contact tip (30) in FIG. completely masks the true photocurrent fluctuation, the method of the present invention allows a significantly increased sensitivity of the measurement without disturbing effects due to the contacting.

2) n-doped silicon

The comments regarding p-doped silicon can be essentially transferred to n-doped silicon. Given n-doped silicon, however, an electron current that is generated by the injection of electrons in the boundary surface between the silicon and the electrolyte flows in addition to the photocurrent generated by the light (carried by holes as minority carriers). The dependency of additional electron injection current on the parameters of the system is fundamentally known in the art (See V. Lehmann, *Dissertation*, University of Erlangen, 1988).

As in the case of p-silicon, either the rear surface 10 can be anodically contacted and the front surface 9 can be cathodically contacted, whereby the rear surface must then be generally illuminated or vice versa.

3) Silicon Wafers Having pn Junctions or Doping Steps

The method can also be employed here. Given the presence of a doping step, only a slight modification of the characteristics appear; given wafers having on junctions, the arrangement (for example, p-doped silicon substrate/n-doped silicon layer/silicon-to-electrolyte junction), however, represents a type of transistor. Consequently, a current injected across the pn junction that is dependent on doping, geometry, illumination and the operating point employed can also flow even without illumination, given appropriate voltage relationships. The intended current supply according to the present invention, however, can always be achieved. When a doping step or a pn junction is not present on the entire surface, this is to be treated correspondingly as a mixed case.

4) Other Semiconductors

The considerations provided for silicon wafers can be directly transferred to other semiconductors. The characteristics in suitable electrolytes must merely be known.

5) Other Voltage Supply

Figure 6:
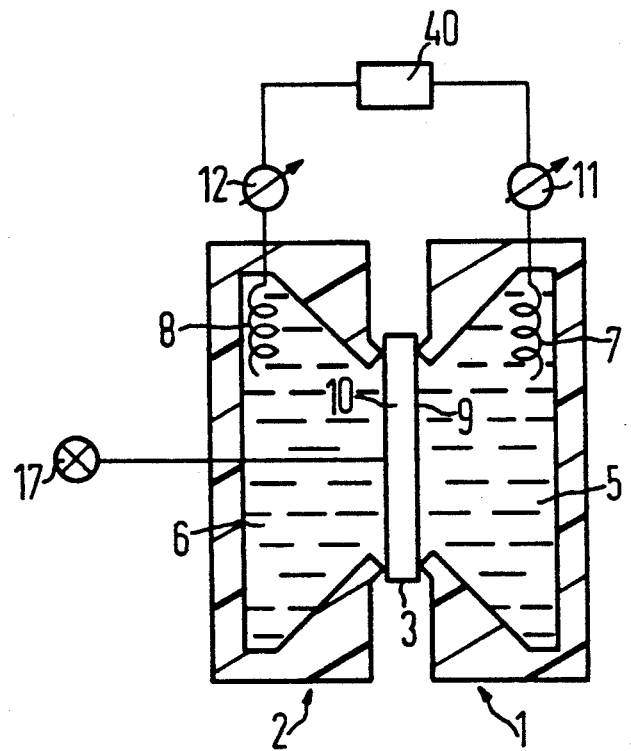
FIG. 6 is a schematic representation of an embodiment of the electrolyte double cell employing a single DC voltage source.

As indicated in FIG. 6, only one power pack device 40 can also be employed, this being connected to both electrodes 7 and 8, since, due to the current supply of the present invention via the silicon-to-electrolyte contact, the only contact 4 is not required for current supply. The voltage source 40 generates the voltage $U_1+U_2$.

In the generally-existing case of a current that is not chronologically constant, this type of interconnection differs from that having two voltage sources. When the current $I_1$ changes, the current $I_2$ must also correspondingly change and, given a voltage $U_1+U_2$ that is held constant, the operating points shift, this, in turn, resulting in a change of the internal sub-voltage $U_1$ and, therefore, in the depth of the space charge zone in the semiconductor wafer 3. Further, no simple control possibility is available. The shift of the operating point, however, can be optimized with a suitable selection of the characteristic.

6) Single-Side Contacting by the Electrolyte

The method and apparatus of the present invention of an electrolyte contact at the rear surface 10 of the wafer can also be employed when the current flow at the front surface of the wafer does not occur through an electrolyte 5, but in some other manner, for example, via an electrically-conductive, gaseous medium (plasma) or via a metallic contact.

The required current for the planned processing of the front surface defines the most advantageous embodiment of the current supply through the electrolyte contact on the rear surface. The cell 2 of the rear side can often be connected in a conducting direction, so that the corresponding operating point can be set with the assistance of the parameters of the system (for example, electrolyte concentration, voltage) and the illumination is not necessary.

7) General Application of the Invention

The present invention generally covers utilization of a semiconductor-to-electrolyte contact for the purpose of current supply. Further applications wherein the illumination is foregone are also thereby covered in that, for example, the fundamentally-inhibiting properties of the one semiconductor-to-electrolyte junction are desired. In each case, however, the current through the front surface of the semiconductor wafer must be equal to that through the rear surface in terms of amount.

Although we have described our invention by reference to particular illustrative embodiments thereof, many changes and modifications of the invention may become apparent to those skilled in the art without departing from the spirit and scope of the invention. We, therefore, intend to include within the patent warranted hereon all such changes and modifications as may reasonably and properly be included within the scope of our contribution to the art.

We claim:

1. A method of establishing large-area electrical contacting of a semiconductor crystal body which includes a first side with a first surface and a second side with a second surface, comprising the steps of: applying a first cell having a first electrode therein to the first side such that the first surface is exposed to the interior of the first cell;
applying a second cell having a second electrode therein to the second side such that
the second surface is exposed to the interior of the second cell; filling at least the second cell with an electrolyte to contact the second surface and the second electrode;
applying a voltage between the first and second electrodes and polarizing the first cell in the conducting direction and polarizing the second cell in the non-conducting direction;
illuminating the second surface; and
controlling the intensity of illumination as a current-flow parameter and to establish a current flow between said first and second electrodes through the semiconductor crystal body.

2. A method of establishing large-area electrical contacting of a semiconductor crystal body which includes a first side with a first surface and a second side with a second surface, comprising the steps of: applying a first cell having a first electrode therein to the first side such that the first surface is exposed to the interior of the first cell;
applying a second cell having a second electrode therein to the second side such that
the second surface is exposed to the interior of the second cell; filling at least the second cell with an electrolyte to directly contact the second surface and the second electrode;
applying a voltage between the first and second electrodes;
illuminating the second surface; and
controlling the intensity of illumination of the second surface to control a current flow between said first and second electrodes through the semiconductor crystal body.

3. Apparatus for large-area electrical contacting of a semiconductor crystal body which comprises a first side including a first surface and an opposite second side including a second surface, comprising: a hollow first cell, including a first electrode therein,
connected to said first side to expose said first surface to the interior of said first cell; a hollow second cell, including a second electrode therein, connected to said second side to expose said second surface to the interior of said second cell; electrolyte filling at least said second cell and in contact with said second electrode and said second surface; voltage means for applying a voltage between said first and second electrodes, including at least one voltage source; and light means for illuminating the semiconductor crystal body;
aid voltage means, said electrolyte and said light means causing a current flow from said first electrode through the semiconductor body to said second electrode with the aid of at least one control parameter,
at least one said voltage means, said electrolyte and said light means being variable in, respectively, voltage, type of electrolyte concentration of electrolyte, and intensity of illumination of at least one of said first and second surfaces of said semiconductor body to control current flow.

4. The apparatus of claim 3, wherein:
said voltage means includes means for polarizing said first cell in the conducting direction and said second cell in the non-conducting direction; and
said light means is operable to illuminate said semiconductor crystal body such that the control parameter is the intensity of illumination of said second surface.

5. The apparatus of claim 3, further comprising:
an electrical control circuit connected to said voltage means for maintaining an optimum operating point.

6. The apparatus of claim 3, wherein:
said light means includes means for illuminating the semiconductor crystal body over the entirety of its first and second surfaces.

7. The apparatus of claim 3, wherein:
said light means comprises scanning means for scanning said semiconductor crystal body with a punctiform light spot.

8. The apparatus of claim 3, wherein:
said voltage means comprises a DC voltage source including first and second poles respectively connected to said first and second electrodes.

9. The apparatus of claim 3, wherein:
an ohmic contact is carried on said semiconductor crystal body;
and said voltage means comprises first and second serially-connected DC voltage sources including a common connection connected to said ohmic contact and to a referenced potential and first and second poles connected to respective ones of said electrodes.

10. The apparatus of claim 3, wherein:
said semiconductor crystal body comprises a pn junction.

* * * * *